United States Patent
Tu et al.

(10) Patent No.: US 9,705,025 B2
(45) Date of Patent: Jul. 11, 2017

(54) PACKAGE STRUCTURE OF AN OPTICAL MODULE

(71) Applicant: Lingsen Precision Industries, Ltd., Taichung (TW)

(72) Inventors: Ming-Te Tu, Taichung (TW); Yu-Chen Lin, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/072,267

(22) Filed: Nov. 5, 2013

(65) Prior Publication Data
US 2015/0028359 A1  Jan. 29, 2015

(30) Foreign Application Priority Data

Jul. 25, 2013  (TW) .............................. 102126694 A

(51) Int. Cl.
| | |
|---|---|
| H01L 31/173 | (2006.01) |
| H01L 31/0203 | (2014.01) |
| H01L 33/54 | (2010.01) |
| H01L 27/15 | (2006.01) |
| H01L 31/167 | (2006.01) |
| H01L 23/00 | (2006.01) |

(52) U.S. Cl.
CPC ........ *H01L 31/167* (2013.01); *H01L 31/0203* (2013.01); *H01L 31/173* (2013.01); *H01L 33/54* (2013.01); H01L 24/73 (2013.01); H01L 2224/32225 (2013.01); H01L 2224/48091 (2013.01); H01L 2224/48227 (2013.01); H01L 2224/73265 (2013.01)

(58) Field of Classification Search
None
See application file for complete search history.

(56) References Cited

U.S. PATENT DOCUMENTS

| | | | | |
|---|---|---|---|---|
| 8,080,819 | B2* | 12/2011 | Mueller et al. | 257/13 |
| 8,362,496 | B1* | 1/2013 | Tu et al. | 257/82 |
| 2007/0080361 | A1* | 4/2007 | Malm | 257/99 |
| 2007/0216001 | A1* | 9/2007 | Nakamura | 257/678 |
| 2008/0296589 | A1* | 12/2008 | Speier et al. | 257/82 |
| 2009/0140266 | A1* | 6/2009 | Liu et al. | 257/82 |

(Continued)

FOREIGN PATENT DOCUMENTS

TW    M428490 U    5/2012

*Primary Examiner* — Johannes P Mondt
(74) *Attorney, Agent, or Firm* — Muncy, Geissler, Olds & Lowe, P.C.

(57) ABSTRACT

This invention relates to an optical module package structure. A substrate is defined with a light receiving region and a light emitting region. A light receiving chip and a light emitting chip are disposed on the light receiving region and the light emitting region of the substrate, respectively. An electronic unit is disposed on the substrate and electrically connected to the light emitting chip. Two encapsulating gels are coated on each of the chips and the electronic unit. A cover is disposed on the substrate and has a light emitting hole and a light receiving hole, located above the light emitting chip and the light receiving chip, respectively. In this way, the package structure of the optical module of the present invention integrates passive components, functional ICs or dies into a module, and the optical module provides the functions of current limiting or function adjustment.

7 Claims, 2 Drawing Sheets

(56) References Cited

U.S. PATENT DOCUMENTS

| | | | |
|---|---|---|---|
| 2010/0181578 A1* | 7/2010 | Li et al. ........................... | 257/82 |
| 2010/0190298 A1* | 7/2010 | Kuramoto et al. ........... | 438/121 |
| 2011/0108714 A1* | 5/2011 | Yang ................... | H01L 31/0203 |
| | | | 250/216 |
| 2011/0266559 A1* | 11/2011 | Zitzlsperger ............. | G01V 8/12 |
| | | | 257/84 |
| 2013/0135605 A1* | 5/2013 | Wada ....................... | G01C 3/00 |
| | | | 356/4.01 |

* cited by examiner

PACKAGE STRUCTURE OF AN OPTICAL MODULE

BACKGROUND OF THE INVENTION

Field of the Invention

The present invention relates to a package structure, especially related to a package structure of an optical module.

Descriptions of the Related Art

Currently, optical proximity sensing modules have become a mainstream technology choice of the new generation of intelligent electronic devices (such as smart phones). When the electronic device is close to someone's ears (face detection) or placed in a pocket, the module will immediately turn off the screen display to save power and prevent accidental screen presses to provide a better user experience. The action principle of the module is emitting a light source with a light emitting chip, such as a light emitting diode (LED), the light is reflected by the surface of an object and is then projected onto a light receiving chip to be converted to electrical signals for subsequent processing.

Taiwan Patent M428490 provides a package structure of an optical module. The package structure comprises a substrate, a light emitting chip, a light receiving chip, a cover and two encapsulating gels. Each of the chips is disposed on a substrate. The cover having a light emitting hole and a light receiving hole is affixed on the substrate and covers the light emitting chip and the light receiving chip separately to form chambers, respectively. Each of the encapsulating gels is filled in each of the chambers to coat each of the chips in order to achieve the above purposes.

However, the internal components of the optical module mainly comprise the light emitting chip and the light receiving chip, and the optical module only works after being equipped with other functional modules or related passive components. This way leads to an overall structure volume increase of the whole optical elements and the high assembly costs.

In summary, the conventional optical module has the above drawbacks and needs to be improved.

SUMMARY OF THE INVENTION

The main objective of the present invention is to provide a package structure of an optical module to effectively reduce the volume of the whole structure and to decrease the packaging costs.

In order to achieve the above objective, the package structure of an optical module of the present invention comprises a substrate, a light emitting chip, a light receiving chip, an electronic unit, two encapsulating gels and a cover. The substrate is defined with a light receiving region and a light emitting region. The light receiving chip is disposed on the light receiving region of the substrate. The light emitting chip is disposed on the light emitting region of the substrate. The electronic unit is disposed on the substrate and is electrically connected to the light emitting chip. Each of the encapsulating gels is coated on the light receiving chip, the light emitting chip and the electronic unit. The cover is disposed on the substrate and has a light emitting hole and a light receiving hole, and the light emitting hole and the light receiving hole are located above the light emitting chip and the light receiving chip, respectively.

Each of the encapsulating gels and the cover are made of light transmissive resin and opaque resin, respectively.

The cover has a first receiving space and a second receiving space, and the first receiving space and the second receiving space are connected to the light emitting hole and the light receiving hole, respectively.

The light receiving chip and the light emitting chip are received in the first receiving space and the second receiving space, respectively.

The substrate is a non-ceramic substrate, which comprises an organic Bistmaleimide Triazine substrate.

The present invention further provides a packaging method of an optical module, and the method comprises the following steps of:

(a) defining an emitting region and a receiving region on a substrate;

(b) electrically connecting the electronic unit to the substrate;

(c) electrically connecting a light receiving chip and a light emitting chip to the emitting region and the receiving region of the substrate, respectively;

(d) disposing an opaque cover on the substrate; and (e) forming light transmissive encapsulating gels on each of the chips and the electronic unit.

The electronic unit and the substrate are disposed by Surface Mount Technology.

The electronic unit and the light emitting chip are electrically connected in series or in parallel.

Each of the chips is electrically connected to the substrate by a wire bonding process and a die attaching process.

The packaging method further comprises a step (f) of cutting or punching the optical module made in the step (a) to step (d).

Thereby, the package structure of the optical module of the present invention integrates the electronic units, such as passive elements, functional ICs and dies, into one package structure. The optical module of the present invention having the design of electrically connecting the electronic unit and the light emitting chip provides the functions of current limiting or function adjustment without being cooperated with other modules. Therefore, compared to the conventional art, the present invention not only decreases the work process of assembling and packaging but also reduces the whole structure volume and decreases the packaging costs.

To provide a further understanding of the composition, characteristics and purpose of the present invention, the following are descriptions describe several embodiments of the present invention to explain the drawings in detail for people skilled in this technical field can implement. The following description lists the embodiments to merely illustrate the technical contents and characteristics of the present invention. People have a general knowledge of this technical field of the present invention can proceed with various simple modifications, replacements, or member omitting belonging to the scope of the present invention intended to protect.

DESCRIPTION OF THE PREFERRED EMBODIMENT

In order to illustrate the structure, characteristics and effectiveness of the present invention in detail, a preferred embodiment and corresponding diagrams are illustrated as follows.

Figure 1:
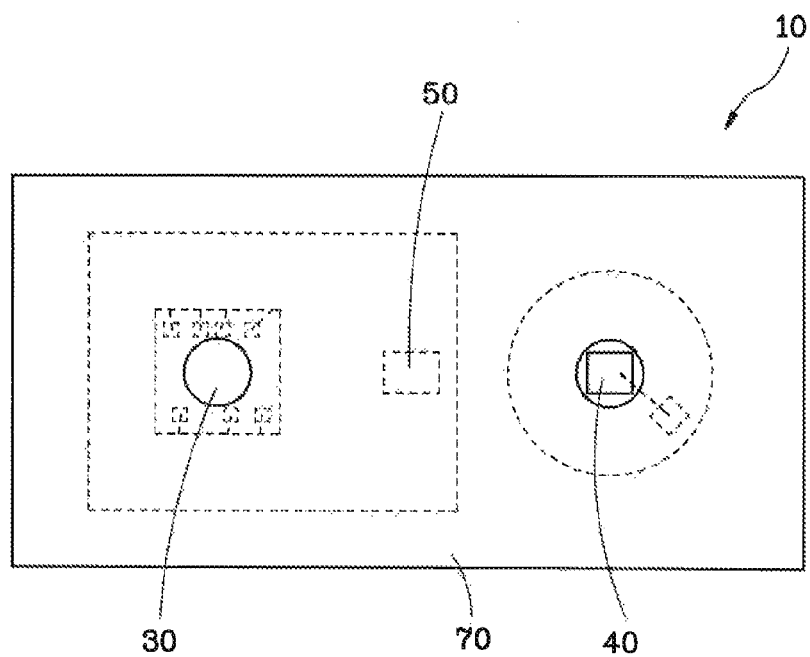
FIG. 1 is a top view of a preferred embodiment of the present invention.
Figure 2:
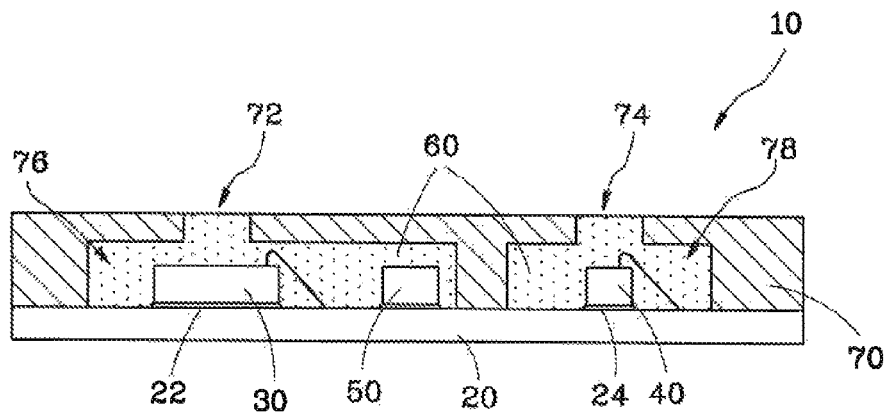
FIG. 2 is a cross-sectional view along the 2-2 section line of FIG. 1 of a preferred embodiment of the present invention.
Figure 3:
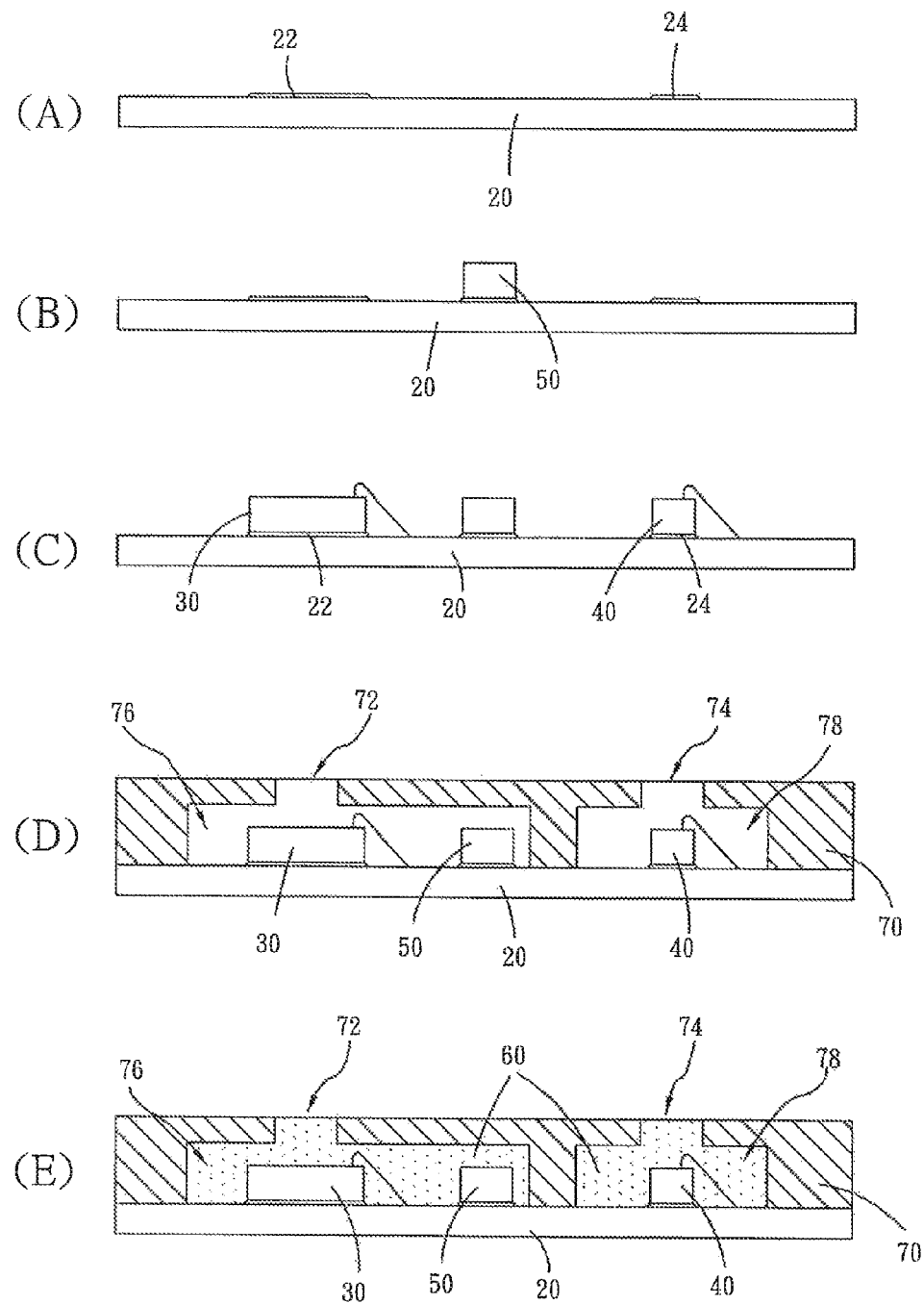
FIG. 3 is a packaging flow diagram of a preferred embodiment of the present invention.

Please refer to FIG. 1 and FIG. 2. The package structure of an optical module 10 provided by a preferred embodiment of the present invention is cut from a module of the package array and comprises a substrate 20, a light receiving chip 30, a light emitting chip 40, an electronic unit 50, two encapsulating gels 60, and a cover 70.

The substrate 20 in the preferred embodiment is a non-ceramic substrate, such as a Bismaleimide Triazine (known as BT) substrate or a glass fiber (known as FR4) substrate made of organic materials. Thereby, the material cost of the substrate 20 is low. The surface of the substrate 20 is defined with a light receiving region 22 and a light emitting region 24.

The light emitting chip 40 and the light receiving chip 30 are treated by a die attaching process and a wire bonding process and are disposed on the light receiving region 22 and the light emitting region 24 of the substrate 20. The light emitting chip 40 is used to emit light, and the light receiving chip 30 is used to receive the light emitted from the light emitting chip 40.

The electronic unit 50 is disposed on the substrate 20 by Surface Mount Technology and is electrically connected to the light emitting chip 40 in series or in parallel. Thereby, the light emitting chip 40 has a function of current limiting or function adjustment.

Each of the encapsulating gels 60 is made of light transmissive resin, such as transparent epoxy resin. Each of the encapsulating gels 60 is coated on the light receiving chip 30 and the light emitting chip 40, respectively, and each of the encapsulating gels 60 is disposed on the light emitting chip 40 and the light receiving chip 30, respectively.

The cover 70 is integrally molded with the opaque resin, such as opaque epoxy resin. The cover 70 is disposed on the substrate 20 and each of the encapsulating gels 60. The cover 70 has a light receiving hole 72, a light emitting hole 74, a first receiving space 76 connected to the light receiving hole 72 and a second receiving space 78 connected to the light emitting hole 74. The light receiving hole 72 and the light emitting hole 74 are located above the light emitting chip 40 and the light receiving chip 30, respectively, and the light receiving chip 30 and the light emitting chip 40 are received in the first receiving space 76 and the second receiving space 78, respectively.

FIGS. 3(A) to 3(E) show the packaging process of the optical module of the present invention. The first step A is defining the light receiving region 22 and the light emitting region 24 on a single substrate 20 of each array substrate. The second step B is disposing the electronic units 50 on the substrate 20 by surface mount technology. The third step C is disposing the light receiving chip 30 and the light emitting chip 40 on the light receiving region 22 and the light emitting region 24 of the substrate 20, respectively, by a die attaching process and a wire bonding process. The fourth step D is positioning the opaque cover 70 at a predetermined position, and the predetermined position in the present embodiment is to form the light receiving hole 72 and the light emitting hole 74 of the cover 70 above the light receiving chip 30 and the light emitting chip 40. The cover is cap attached on the substrate 20. The light receiving chip 30, the light emitting chip 40 and the electronic unit 50 are received in the first receiving space 76 and the second receiving space 78, respectively. The fifth step E is filling the light transmissive encapsulating gels 60 through the light receiving hole 72 and the light emitting hole 74 of the cover 70. The encapsulating gels 60 are filled in the first receiving space 76 and the second receiving space 78 and coat the light receiving chip 30 and the light emitting chip 40. Thereby, the light transmission loss and distortion happened between the light emitting chip 40 and the light receiving chip 30 is reduced, and the chips 30, 40 are protected.

In summary, the electronic unit 50 of the optical module of the present invention provides electrical signals with current limiting or function adjustment to the light emitting chip 40 for light emission. The light emitted from the light emitting chip 40 passes the encapsulating gels 60 and then projected on the surface of the object through the light emitting hole 74 of the cover 70. The light reflected from the surface of the object is received through the light receiving hole 72 of the cover 70 and is projected on the encapsulating gels 60. The light is then transmitted though the encapsulating gels 60 to the light receiving chip 30. The light receiving chip 30 converts the received light signals into electrical signals for operation processing. In this way, the package structure of the optical module of the present invention integrates electronic units, such as passive components, functional ICs or dies, into a single package structure. With the design of electrically connecting the electronic unit and the light emitting chip, the optical module of the present invention provides the functions of current limiting or function adjustment without being cooperated with other modules. Therefore, compared to the conventional art, the present invention not only decreases the work process of assembling and packaging but also reduces the whole structure volume and decreases the packaging costs.

The constituent elements in the above embodiments of the present invention are only for illustration and are not intended to limit the scope of the present invention. Other substitutions, equivalent elements or changes should be covered by the scope of the claim of the present invention.

What is claimed is:
1. A package structure of an optical module, comprising:
   a substrate being defined with a light receiving region and a light emitting region;
   a light receiving chip disposed on the light receiving region of the substrate;
   a light emitting chip disposed on the light emitting region of the substrate;
   an electronic unit disposed on the substrate and electrically connected to the light emitting chip;
   two encapsulating gels coated on the light receiving chip, the light emitting chip and the electronic unit; and
   a cover disposed on the substrate and having a light emitting hole and a light receiving hole, and the light emitting hole and the light receiving hole being located above the light emitting chip and the light receiving chip, respectively,
   wherein the cover has a first receiving space and a second receiving space individually separated from the first receiving space,
   wherein the first receiving space and the second receiving space are connected to the light receiving hole and the light emitting hole, respectively,
   wherein the light receiving chip and the light emitting chip are received in the first receiving space and the second receiving space, respectively, and the electronic unit is received in the first receiving space, wherein one of the two encapsulating gels is filled in the light receiving hole and the first receiving space, and the other of the two encapsulating gels is filled in the light emitting hole and the second receiving space.

2. The package structure of the optical module as claimed in claim 1, wherein each of the encapsulating gels and the cover are made of light transmissive resin and opaque resin, respectively.

3. The package structure of the optical module as claimed in claim 1, wherein the substrate is a non-ceramic substrate, which comprises an organic Bismaleimide Triazine substrate.

4. A packaging method of an optical module, the method comprising the following steps of:
  (a) defining an emitting region and a receiving region on a substrate;
  (b) electrically connecting an electronic unit to the substrate;
  (c) electrically connecting a light receiving chip and a light emitting chip to the receiving region and the emitting region of the substrate, respectively;
  (d) disposing an opaque cover on the substrate, wherein the cover has a light emitting hole, a light receiving hole, a first receiving space and a second receiving space individually separated from the first receiving space, and the first receiving space and the second receiving space are connected to the light receiving hole and the light emitting hole, respectively, the light receiving chip and the light emitting chip are received in the first receiving space and the second receiving space, respectively, and the electronic unit is received in the first receiving space;
  (e) forming two light transmissive encapsulating gels on each of the chips and the electronic unit; and
  (f) filling one of the two encapsulating gels in the light receiving hole and the first receiving space, and filling the other of the two encapsulating gels in the light emitting hole and the second receiving space.

5. The packaging method of the optical module as claimed in claim 4, wherein the electronic unit and the substrate are disposed by Surface Mount Technology.

6. The packaging method of the optical module as claimed in claim 4, wherein the electronic unit and the light emitting chip are electrically connected in series or in parallel.

7. The packaging method of the optical module as claimed in claim 4, wherein each of the chips is electrically connected to the substrate by a wire bonding process and a die attaching process.

* * * * *